United States Patent
Kim et al.

(10) Patent No.: US 11,678,558 B2
(45) Date of Patent: Jun. 13, 2023

(54) MASK ASSEMBLY AND APPARATUS AND METHOD OF MANUFACTURING DISPLAY APPARATUS

(71) Applicant: SAMSUNG DISPLAY CO., LTD., Yongin-si (KR)

(72) Inventors: Yalim Kim, Yongin-si (KR); Jongdae Lee, Yongin-si (KR); Sangheon Jeon, Yongin-si (KR); Dongseob Jeong, Yongin-si (KR); Youngeun Ryu, Yongin-si (KR); Minju Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/380,430

(22) Filed: Apr. 10, 2019

(65) Prior Publication Data

US 2020/0058906 A1 Feb. 20, 2020

(30) Foreign Application Priority Data

Aug. 20, 2018 (KR) ........................ 10-2018-0096831

(51) Int. Cl.
*H01L 51/56* (2006.01)
*H01L 51/00* (2006.01)

(52) U.S. Cl.
CPC .......... *H01L 51/56* (2013.01); *H01L 51/0011* (2013.01); *H01L 51/001* (2013.01)

(58) Field of Classification Search
CPC ................. H01L 51/0011; H01L 51/56; H01L 27/3241–3295; C23C 14/042; H05B 33/10

See application file for complete search history.

(56) References Cited

U.S. PATENT DOCUMENTS 8,968,477 B2    3/2015   Kang et al.
2003/0180474 A1*  9/2003  Nishikawa ............ C23C 14/042
                                                 427/468

(Continued)

FOREIGN PATENT DOCUMENTS

EP    2 940 752 A1   11/2015
JP    3539597 B2    5/1997

(Continued)

OTHER PUBLICATIONS

Kummamuru, Ravi et al., "A close proximity self-aligned shadow mask for sputter deposition onto a membrane or cavity," Journal of Micromechanics and Microengineering, vol. 18, 2008, 9 pages.

(Continued)

*Primary Examiner* — John A Bodnar
(74) *Attorney, Agent, or Firm* — Lewis Roca Rothgerber Christie LLP

(57) ABSTRACT

A mask assembly and an apparatus and method for manufacturing a display apparatus are provided. A mask assembly includes a mask frame and a mask on the mask frame and having at least one opening. The mask includes a mask body portion having the at least one opening, and a protruding portion arranged to surround the at least one opening and including an inner surface defining the at least one opening, the protruding portion protruding from the mask body portion and configured to protrude toward a display substrate and contact the display substrate. A deposition material is configured to pass through the at least one opening to be deposited in an entire display area of a display panel including a plurality of pixels.

24 Claims, 6 Drawing Sheets

(56) References Cited

U.S. PATENT DOCUMENTS

| | | |
|---|---|---|
| 2005/0199580 A1 | 9/2005 | Yang et al. |
| 2007/0159048 A1 | 7/2007 | Chang et al. |
| 2010/0021829 A1* | 1/2010 | Kang .................. H01L 27/3211 430/5 |
| 2015/0114297 A1* | 4/2015 | Kawato ................. C23C 14/042 118/726 |
| 2016/0132148 A1* | 5/2016 | Han ...................... G06F 3/0443 345/174 |
| 2017/0098768 A1 | 4/2017 | Yamaguchi |
| 2017/0179420 A1 | 6/2017 | Lee et al. |
| 2018/0053894 A1* | 2/2018 | Miyadera ............ H01L 51/0011 |

FOREIGN PATENT DOCUMENTS

| | | |
|---|---|---|
| JP | 2001-023773 A | 1/2001 |
| KR | 10-2006-0006175 A | 1/2006 |
| KR | 10-1291795 B1 | 7/2013 |
| KR | 10-2018-0041294 A | 4/2018 |

OTHER PUBLICATIONS

Tiggelaar, R.M. et al., "Spreading of thin-film metal patterns deposited on nonplanar surfaces using a shadow mask micromachined in Si (110)," J. Vac. Sci. Technol. B, vol. 25, 2007, 10 pages.

EPO Partial search report dated Jan. 20, 2020, for corresponding European Patent Application No. 19183307.8 (22 pages).

* cited by examiner

< RELATED ART >

MASK ASSEMBLY AND APPARATUS AND METHOD OF MANUFACTURING DISPLAY APPARATUS

CROSS-REFERENCE TO RELATED APPLICATION

This application claims priority to and the benefit of Korean Patent Application No. 10-2018-0096831, filed on Aug. 20, 2018 in the Korean Intellectual Property Office, the entire disclosure of which is incorporated herein by reference.

BACKGROUND

1. Field

Aspects of one or more embodiments relate to apparatuses and methods, and, more particularly, to a mask assembly, an apparatus for manufacturing a display apparatus, and a method of manufacturing a display apparatus.

2. Description of the Related Art

Mobility-based electronic devices have been widely used. Mobile electronic devices may include compact electronic devices, such as mobile phones, as well as tablet personal computers (PCs) which are recently widely used.

In order to support various functions, the mobile electronic devices may include a display apparatus for providing a user with visual information such as an image or a video. Recently, as other parts to drive a display apparatus are miniaturized, a portion of the display apparatus in an electronic device is gradually increasing. In this regard, a structure of being bent at a certain angle in a flat state is under development.

To manufacture the display apparatus, various layers may be manufactured. In this regard, for some layers, a deposition material may be ejected in a vacuum state to be deposited in a certain area. In this case, the deposition material may be deposited not only in a designed area, but also in an area wider than the designed area. Accordingly, it is necessary or desired to accurately limit a deposition range of the deposition material in the display apparatus. As a result, a product may be miniaturized or a space for arranging other parts may be obtained.

SUMMARY

As a display area increases due to an increase of a shadow area in which part of a deposition material is deposited, the size of a display apparatus may be increased or a space for arranging other parts may not be obtained. According to aspects of one or more embodiments, a mask assembly may reduce a shadow area, and an apparatus for manufacturing a display apparatus, and a method of manufacturing a display apparatus are provided.

Additional aspects will be set forth, in part, in the description which follows and, in part, will be apparent from the description, or may be learned by practice of the presented embodiments.

According to one or more embodiments, a mask assembly includes a mask frame and a mask disposed on the mask frame and having at least one opening. The mask includes a mask body portion having the at least one opening, and a protruding portion arranged to surround the at least one opening and including an inner surface defining the at least one opening, the protruding portion protruding from the mask body portion and configured to protrude toward a display substrate and contact the display substrate. A deposition material is configured to pass through the at least one opening to be deposited in an entire display area of a display panel including a plurality of pixels.

A distance between the mask body portion and the display substrate may be greater than or equal to about 30 μm.

A thickness of a portion of the protruding portion may vary along a first direction.

The inner surface of the protruding portion may be inclined along the first direction.

An inclination of the inner surface of the protruding portion may decrease toward a center of the at least one opening.

An inclination angle of the inner surface of the protruding portion may be greater than or equal to about 40° and less than or equal to about 60°.

The inner surface of the protruding portion may be curved.

The protruding portion may be arranged at a boundary of a pixel defining layer of the display substrate.

According to one or more embodiments, an apparatus for manufacturing a display apparatus includes a chamber in which a display substrate is configured to be arranged, a mask assembly in the chamber and configured to face the display substrate, and a source unit in the chamber and configured to supply a deposition material to the display substrate by passing the deposition material through the mask assembly, in which the mask assembly includes a mask frame and a mask on the mask frame and having at least one opening, the mask including a mask body portion having the at least one opening, and a protruding portion arranged to surround the at least one opening and including an inner surface defining the at least one opening, the protruding portion protruding from the mask body portion and configured to protrude toward a display substrate and contact the display substrate, in which a deposition material is configured to pass through the at least one opening to be deposited in an entire display area of a display panel including a plurality of pixels.

A distance between the mask body portion and the display substrate may be greater than or equal to about 30 μm.

A thickness of a portion of the protruding portion may vary along a first direction.

The inner surface of the protruding portion may be inclined along the first direction.

An inclination of the inner surface of the protruding portion may decrease toward a center of the at least one opening.

An inclination angle of the inner surface of the protruding portion may be greater than or equal to about 40° and less than or equal to about 60°.

The inner surface of the protruding portion may be curved.

The protruding portion may be arranged at a boundary of a pixel defining layer of the display substrate.

According to one or more embodiments, a method of manufacturing a display apparatus includes arranging a display substrate and a mask assembly in a chamber, aligning the display substrate and the mask assembly with each other, and depositing a deposition material from a source unit on the display substrate by passing the deposition material through the mask assembly, in which the mask assembly includes a mask frame and a mask on the mask frame and having at least one opening, the mask including a mask body portion having the at least one opening, and a protruding portion arranged to surround the at least one opening and including an inner surface defining the at least one opening, the protruding portion protruding from the mask body portion toward the display substrate and contacting the display substrate, in which the deposition material that passes through the at least one opening is deposited in an entire display area of a display panel including a plurality of pixels.

A distance between the mask body portion and the display substrate may be greater than or equal to about 30 μm.

A thickness of a portion of the protruding portion may vary along a first direction in which the inner surface extends.

The inner surface of the protruding portion may be inclined along the first direction.

An inclination of the inner surface of the protruding portion may decrease toward a center of the at least one opening.

An inclination angle of the inner surface of the protruding portion may be greater than or equal to about 40° and less than or equal to about 60°.

The inner surface of the protruding portion may be curved.

The protruding portion may be arranged at a boundary of a pixel defining layer of the display substrate.

According to one or more embodiments, a method of manufacturing a display apparatus includes arranging a display substrate and a mask assembly in a chamber, aligning the display substrate and the mask assembly with each other, and depositing a deposition material from a source unit on a pixel defining layer of the display substrate by passing the deposition material through the mask assembly, in which a first area where the deposition material is deposited on the display substrate is located within a second area where the pixel defining layer is arranged on the display substrate.

The mask assembly may include a mask frame and a mask on the mask frame and having at least one opening, the mask including a mask body portion having the at least one opening, and a protruding portion arranged to surround the at least one opening and including an inner surface defining the at least one opening, the protruding portion protruding from the mask body portion toward the display substrate and contacting the display substrate.

The protruding portion may be arranged between the first area and the second area.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
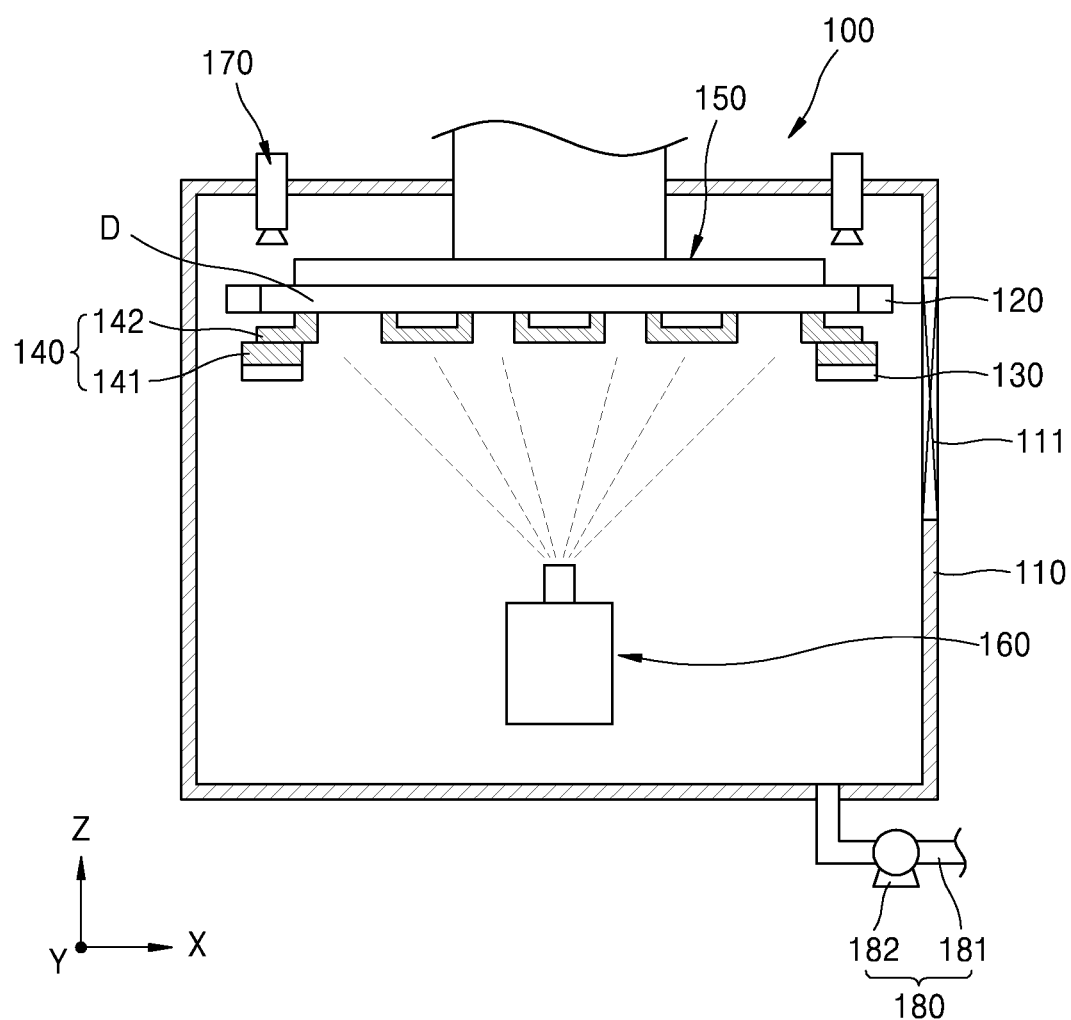
FIG. 1 is a cross-sectional view of an apparatus for manufacturing a display apparatus, according to an embodiment.

As the present disclosure allows for various changes and numerous embodiments, some embodiments will be illustrated in the drawings and described in further detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

In the description of the present disclosure, certain detailed explanations of the related art may be omitted when it is deemed that they may unnecessarily obscure the essence of the disclosure.

It is to be understood that although the terms "first," "second," etc. may be used herein to describe various components, these components should not be limited by these terms. These terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, region, or component is referred to as being "formed on" another layer, region, or component, it may be directly or indirectly formed on the other layer, region, or component. That is, for example, one or more intervening layers, regions, or components may be present.

Sizes and thicknesses of components in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the following embodiments, it is to be understood that when a layer, region, or component is referred to as being "connected to" another layer, region, or component, it may be directly connected to the other layer, region, or component or indirectly connected to the other layer, region, or component via one or more intervening layers, regions, or components. For example, in the present specification, when a layer, region, or component is referred to as being electrically connected to another layer, region, or component, it may be directly electrically connected to the other layer, region, or component or indirectly electrically connected to the other layer, region, or component via one or more intervening layers, regions, or components.

Figure 2:
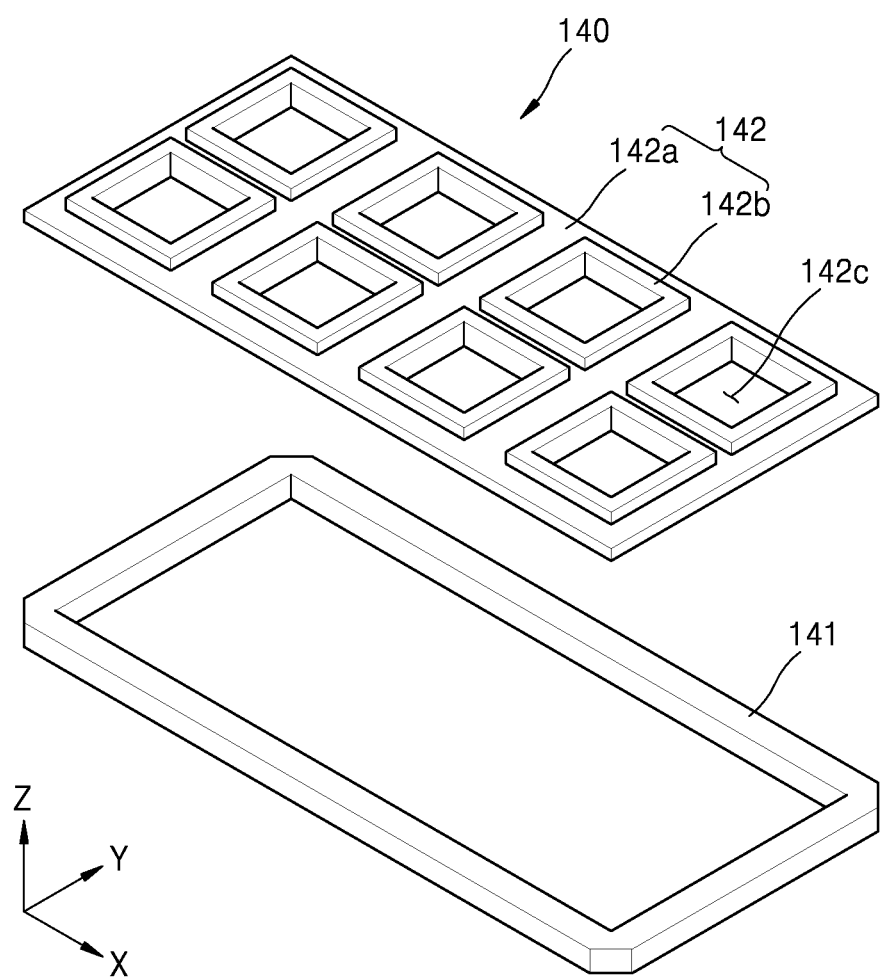
FIG. 2 is an exploded perspective view of a mask assembly of FIG. 1.
Figure 3A:
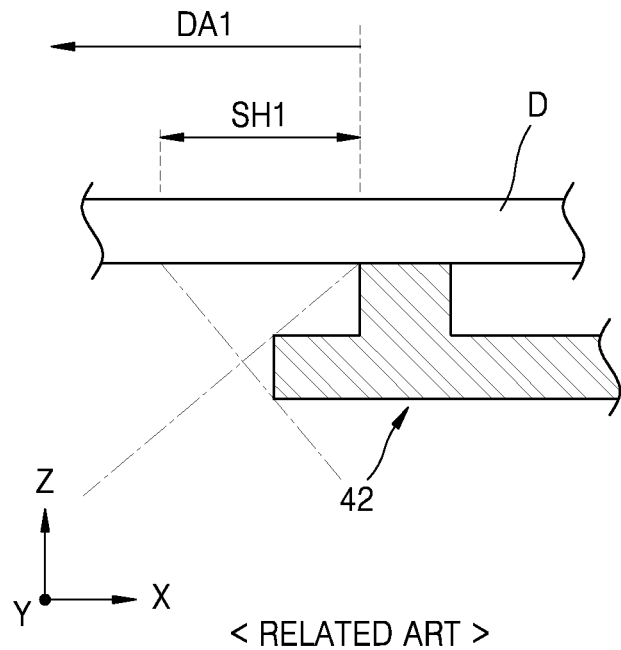
FIGS. 3A and 3B are cross-sectional views showing ranges in which a deposition material is deposited through a mask assembly according to the related art and the mask assembly of FIG. 2, respectively.

FIG. 1 is a cross-sectional view of a display apparatus manufacturing apparatus 100 according to an embodiment; FIG. 2 is an exploded perspective view of a mask assembly 140 of FIG. 1; and FIGS. 3A and 3B are cross-sectional views showing ranges in which a deposition material is deposited through a mask assembly according to the related art and the mask assembly 140 of FIG. 2, respectively.

Figure 3B:
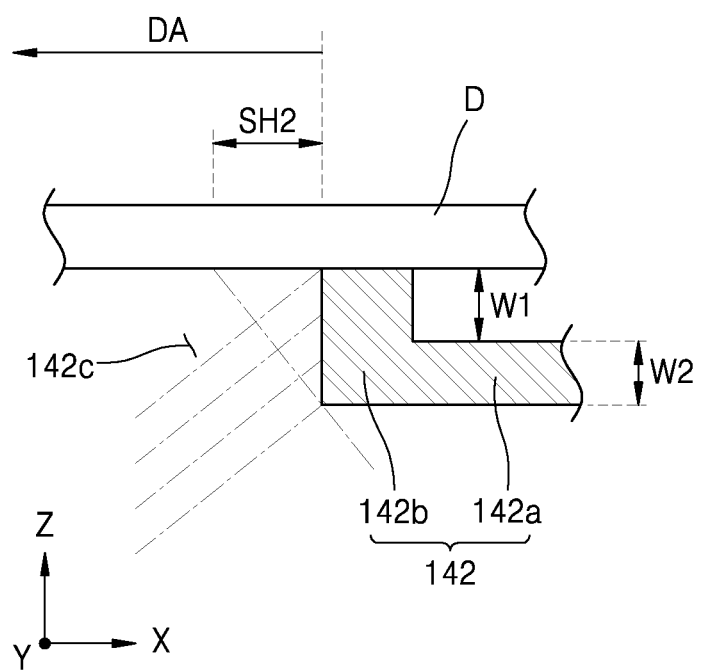

Referring to FIGS. 1, 2, and 3B, the display apparatus manufacturing apparatus 100 may include a chamber 110, a first support unit 120, a second support unit 130, the mask assembly 140, a source unit 160, a magnetic force generation unit 150, a vision unit 170, and a pressure control unit 180.

The chamber 110 may include a space therein. The chamber 110 may have an open portion at one side, and a gate valve 111 for opening/closing the open portion of the chamber 110 may be arranged in the open portion of the chamber 110.

The first support unit 120 may be disposed in the chamber 110. In this state, the first support unit 120 may support a display substrate D. In an embodiment, the display substrate D may be placed on the first support unit 120, and the first support unit 120 may be in a fixed state in the chamber 110. In another embodiment, the first support unit 120 may be formed in a clamp shape and may grip at least a part of the display substrate D, thereby supporting the display substrate D. In another embodiment, the first support unit 120 may be disposed in the chamber 110 to be capable of performing a linear motion to apply a force to the display substrate D, thereby supporting the display substrate D. In another embodiment, the display substrate D may be placed on the first support unit 120, and the first support unit 120 may include a shuttle that performs a linear motion. In another embodiment, the first support unit 120 may include an electrostatic chuck or an adhesive chuck that is disposed to face one surface of the display substrate D. In this case, the first support unit 120 may be disposed on the magnetic force generation unit 150.

The mask assembly 140 may be disposed on the second support unit 130, thereby supporting the mask assembly 140. In this state, the second support unit 130 may be formed the same or similar to the first support unit 120 and may support the mask assembly 140. The second support unit 130 may allow the mask assembly 140 to perform at least one of an ascending and descending motion, a linear motion, and a rotation motion to a degree.

In the following description, for convenience of explanation, a case in which the first support unit 120 supports the display substrate D by performing a linear motion and the second support unit 130 supports the mask assembly 140 from a lower surface of the mask assembly 140 is described in further detail.

The mask assembly 140 may include a mask frame 141 and a mask 142. In an embodiment, the mask frame 141 may have an opening at a center portion thereof. In another embodiment, the mask frame 141 may be formed in a form of a grid. In particular, one or more openings may be in the mask frame 141. For example, the mask frame 141 may have a shape like a window frame. The mask 142 may be disposed on the mask frame 141. In an embodiment, the mask 142 may be provided in a tensioned state on the mask frame 141 and may be fixed to the mask frame 141 by welding. The mask 142 may include at least one opening 142c. In an embodiment, the mask 142 may include a mask body portion 142a and a protruding portion 142b. The mask body portion 142a may be provided in a form of a sheet. In this state, the at least one opening 142c, through which a deposition material passes, may be arranged in the mask body portion 142a. In particular, when the opening 142c includes a plurality of openings, the openings 142c may be arranged spaced apart from each other. The protruding portion 142b may be disposed encompassing an edge of the opening 142c. In this state, the protruding portion 142b may protrude from a surface of the mask body portion 142a toward the display substrate D. In an embodiment, the protruding portion 142b may be disposed on the edge of the opening 142c, forming a closed-loop. In this case, the protruding portion 142b may form an inner surface defining the opening 142c.

In an embodiment, a gap W1 between the surface of the mask body portion 142a from which the protruding portion 142b protrudes and a surface of the display substrate D may be greater than or equal to 30 μm. When the gap between the surface of the mask body portion 142a and the surface of the display substrate D is less than 30 μm, the mask body portion 142a may be in contact with the display substrate D by a magnetic force applied by the magnetic force generation unit 150, and, thus, the display substrate D may be damaged.

In an embodiment, a thickness W2 of the mask body portion 142a may be less than or equal to 70 μm. When the thickness of the mask body portion 142a exceeds 70 μm, a magnetic force may be generated in the mask body portion 142a due to the magnetic force provided by the magnetic force generation unit 150, and, thus, the mask assembly 140 may not be in close contact with the display substrate D or may be in very close contact with the display substrate D, thereby damaging or breaking the display substrate D.

The source unit 160 may supply the deposition material to the inside of the chamber 110. In this state, the source unit 160 may inject an externally supplied deposition material to the inside of the chamber 110 or accommodate a deposition material and vaporize or sublimate the accommodated deposition material, thereby injecting the deposition material to the inside of the chamber 110. Further, the source unit 160 may be disposed in the chamber 110 to be capable of performing a linear motion or disposed in a fixed state in the chamber 110. In an embodiment, when the source unit 160 performs a linear motion, the source unit 160 may be connected to a source driving unit (not shown), such as a linear motor.

The magnetic force generation unit 150 may be disposed in the chamber 110 and may provide a magnetic force to the mask assembly 140. The mask assembly 140 may be in close contact with the display substrate D due to the magnetic force. In this state, the magnetic force generation unit 150 may include a magnet or an electromagnet that provides a magnetic force to the mask assembly 140. Further, the magnetic force generation unit 150 may adjust the strength of the magnetic force applied to the mask assembly 140 through self-control or by moving up or down.

The vision unit 170 may be disposed in the chamber 110 to capture positions of the display substrate D and the mask assembly 140. In this state, the positions of the display substrate D and the mask assembly 140 may be determined based on a result of capturing, and the display substrate D and the mask assembly 140 may be aligned based on the determined positions of the display substrate D and the mask assembly 140.

The pressure control unit 180 may be connected to the chamber 110 to adjust a pressure of the inside of the chamber 110. In an embodiment, the pressure control unit 180 may include a pipe 181 connected to the chamber 110 and a vacuum pump 182 arranged on the pipe 181.

In a method of manufacturing a display apparatus (not shown) by using the display apparatus manufacturing apparatus 100, the display substrate D and the mask assembly 140 may be arranged in the chamber 110. In this state, the open portion of the chamber 110 may be opened as the gate valve 111 operates, and as the vacuum pump 182 operates, the pressure of the inside of the chamber 110 may be maintained the same as or similar to the atmospheric pressure. The display substrate D and the mask assembly 140 may be supplied to the inside of the chamber 110 from the outside of the chamber 110 through a separately provided shuttle or robot arm. In another embodiment, the first support unit 120 and the second support unit 130 may be in the form of a shuttle, and, thus, the first support unit 120 and the second support unit 130 may respectively supply the display substrate D and the mask assembly 140 to the inside of the chamber 110 from the outside of the chamber 110.

The display substrate D may be disposed on the first support unit 120 in the chamber 110. Further, the mask assembly 140 may be disposed on the second support unit 130. The vision unit 170 may capture images of the display substrate D and the mask assembly 140 and determine the positions of the display substrate D and the mask assembly 140. In an embodiment, the image captured by the vision unit 170 may be transmitted to a controller (not shown), and the controller may determine the positions of the display substrate D and the mask assembly 140 based on the images of the display substrate D and the mask assembly 140. In an embodiment, the controller may include portable terminals, mobile phones, or notebook computers which are disposed outside the display apparatus manufacturing apparatus 100. In another embodiment, the controller may include a circuit board.

After determining the positions of the display substrate D and the mask assembly 140, the controller may align the display substrate D and the mask assembly 140 to each other by adjusting the position of the mask assembly 140 through the second support unit 130.

The magnetic force generation unit 150 may allow the mask assembly 140 and the display substrate D to be in close contact with each other. In this state, when the magnetic force generation unit 150 provides a magnetic force, the protruding portion 142b of the mask 142 may be in complete contact with the display substrate D. In this case, the protruding portion 142b may be in contact with the surface of the display substrate D. In particular, the protruding portion 142b may be in contact with a pixel defining layer (not shown) of the display substrate D.

The source unit 160 may supply the deposition material to the inside of the chamber 110. The deposition material may be deposited on the display substrate D by passing through the opening 142c of the mask 142. In this case, the deposition material may be deposited in a display area DA of the display substrate D. In particular, the deposition material may be deposited not only on each pixel of the display area DA, but entirely in the display area DA. In this state, the vacuum pump 182 may exhaust gas in the chamber 110 to the outside of the chamber 110.

The display substrate D, on which the deposition material is deposited as above, may be drawn out of the chamber 110 and may pass through other manufacturing apparatuses to be manufactured as the display apparatus.

Accordingly, according to the display apparatus manufacturing apparatus 100 and the method of manufacturing a display apparatus, it is possible to manufacture precise display apparatuses.

The display area DA may be formed by depositing the deposition material by using the display apparatus manufacturing apparatus 100.

However, referring to FIG. 3A, in a mask assembly according to the related art, the protruding portion is not provided on the edge of the opening. In this case, a first shadow area SH1 in which the deposition material is not formed to a certain thickness may be formed by the edge of the opening of a mask 42 in the related art. In this case, since the deposition material supplied by a source unit (not shown) is injected onto the display substrate D from both sides with respect to the edge of the opening, the first shadow area SH1 may be formed wide. In particular, since the first shadow area SH1 is formed toward the protruding portion of the mask 42 in the related art, the first shadow area SH1 may be extended. In this case, the first shadow area SH1 may become too large. In this state, a display area DA1 of the display apparatus may include the first shadow area SH1. Accordingly, when a display apparatus (not shown) is manufactured by using the mask 42 in the related art, an area of the display area DA1, in which no image is formed, needs to be increased, or a substrate (not shown) needs to be enlarged.

However, as illustrated in FIG. 3B, according to the present disclosure, as the protruding portion 142b encompasses the edge of the opening 142c, a part of the first shadow area SH1 generated due to the edge of the opening 142c may be removed.

For example, unlike the mask assembly according to the related art, in the present disclosure, the protruding portion 142b may form the inner surface defining the opening 142c. In this case, the deposition material injected from the left side of FIG. 3B is blocked by the protruding portion 142b, and, thus, the shadow area may not be extended. In this case, only the deposition material injected from right side of FIG. 3B may form a second shadow area SH2. In this case, the second shadow area SH2 may be formed less than the first shadow area SH1. In other words, since the boundary of the display area may be formed almost similar to a design value, without decreasing a distance between the display area and the non-display area, the size of the substrate may be reduced compared to the related art. In addition, since the boundary of the display area may be almost the same as or similar to the design value or the boundary of the display area may be anticipated, the non-display area may be designed to be small compared with the related art.

Accordingly, according to the display apparatus manufacturing apparatus 100 and the method of manufacturing a display apparatus, the distance between the display area and the non-display area may be reduced. Further, according to the display apparatus manufacturing apparatus 100 and the method of manufacturing a display apparatus, the shadow area may be reduced.

Figure 4:
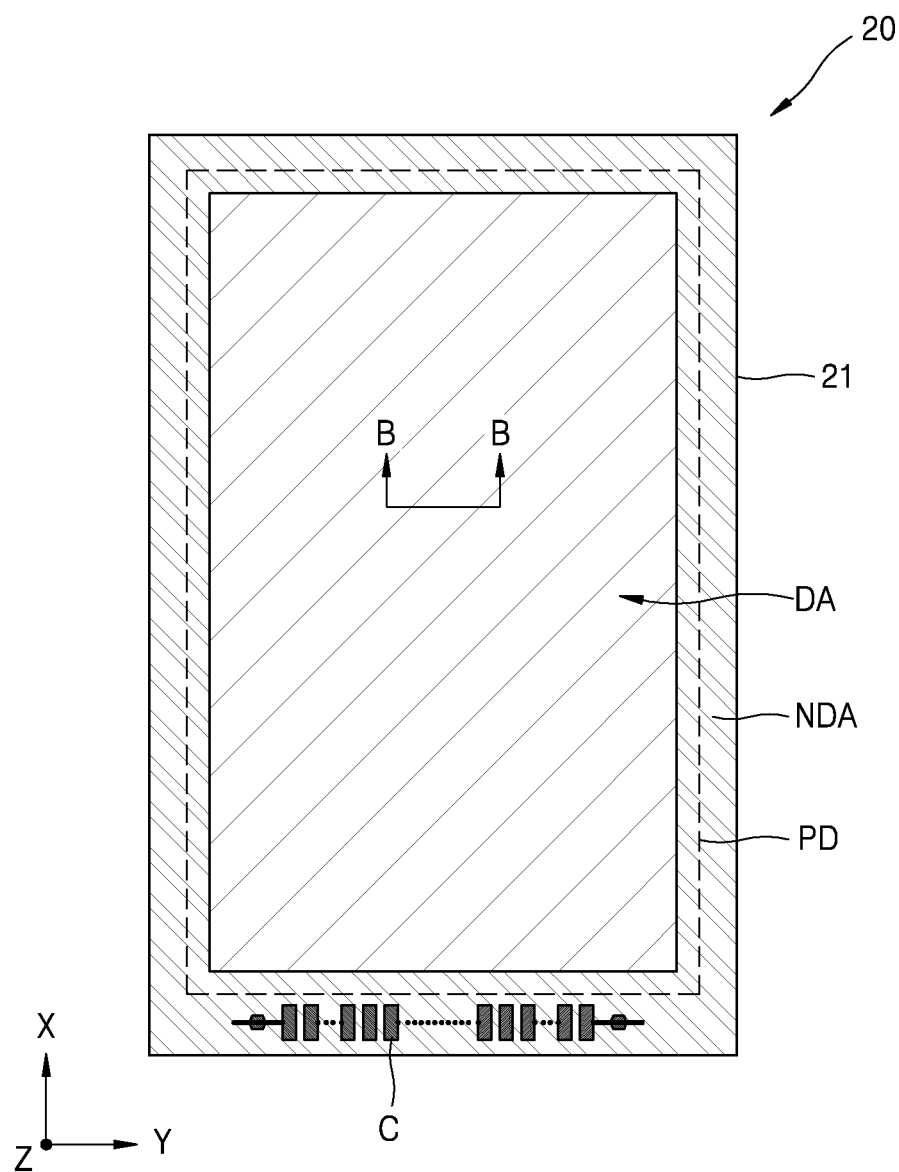
FIG. 4 is a plan view of a display apparatus manufactured using the apparatus for manufacturing a display apparatus illustrated in FIG. 1.
Figure 5:
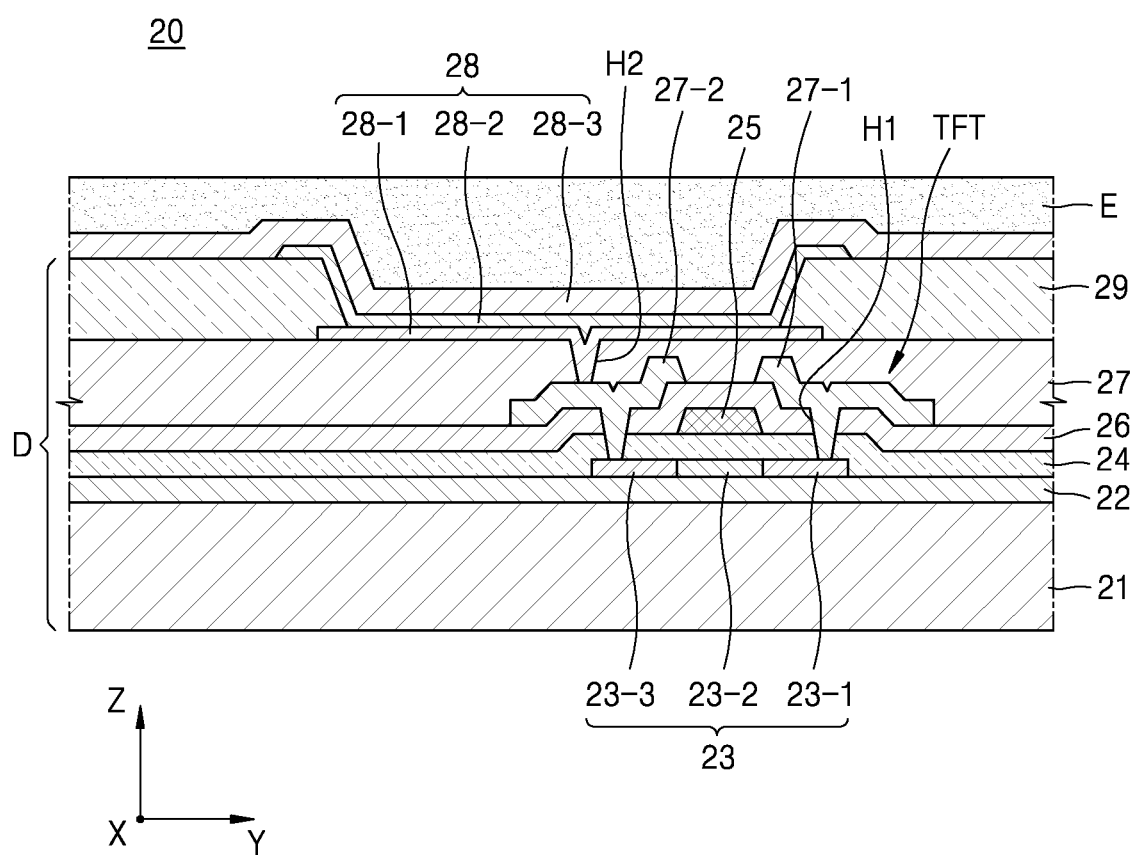
FIG. 5 is a cross-sectional view taken along the line B-B of FIG. 4.

FIG. 4 is a plan view of a display apparatus 20 manufactured using the display apparatus manufacturing apparatus 100 illustrated in FIG. 1; and FIG. 5 is a cross-sectional view taken along the line B-B of FIG. 4.

Referring to FIGS. 4 and 5, the display apparatus 20 may include the display area DA and a non-display area NDA outside the display area DA on a substrate 21. A light-emitting portion may be disposed in the display area DA, and a power wiring (not shown) may be disposed in the non-display area NDA. Further, a pad portion C may be disposed in the non-display area NDA.

The display apparatus 20 may include the display substrate D and a thin film encapsulation layer E. In an embodiment, the display substrate D may include the substrate 21, a thin film transistor TFT, a passivation layer 27, and a pixel electrode 28-1. In another embodiment, the display substrate D may include the substrate 21, the thin film transistor TFT, the passivation layer 27, the pixel electrode 28-1, and part of an intermediate layer 28-2. In another embodiment, the display substrate D may include the substrate 21, the thin film transistor TFT, the passivation layer 27, the pixel electrode 28-1, and the intermediate layer 28-2. In the following description, for convenience of explanation, a case in which the display substrate D includes the substrate 21, the thin film transistor TFT, the passivation layer 27, and the pixel electrode 28-1 is mainly described in further detail.

In an embodiment, the substrate 21 may include a plastic material, or a metal material such as SUS or Ti. Further, the substrate 21 may include polyimide (PI). In the following description, for convenience of explanation, a case in which the substrate 21 is formed of polyimide is mainly described in further detail.

The thin film transistor TFT is formed on the substrate 21. The passivation layer 27 is formed covering the thin film transistor TFT. An organic light-emitting diode (OLED) 28 may be formed on the passivation layer 27.

In an embodiment, a buffer layer 22 formed of an organic compound and/or an inorganic compound is further formed on an upper surface of the substrate 21. The buffer layer 22 may be formed as SiOx (x≥1) or SiNx (x≥1).

After an active layer 23 arranged in a certain pattern is formed on the buffer layer 22, the active layer 23 is buried under a gate insulating layer 24. The active layer 23 may include a source region 23-1 and a drain region 23-3, and may further include a channel region 23-2 between the source region 23-1 and the drain region 23-3.

The active layer 23 may include any of various materials. For example, the active layer 23 may include an inorganic semiconductor material, such as amorphous silicon or crystalline silicon. In another example, the active layer 23 may include an oxide semiconductor. In another example, the active layer 23 may include an organic semiconductor material. However, in the following description, for convenience of explanation, a case in which the active layer 23 is formed of amorphous silicon is mainly described in further detail.

The active layer 23 may be formed by forming an amorphous silicon layer on the buffer layer 22, crystallizing the amorphous silicon layer into a polycrystalline silicon layer, and patterning the polycrystalline silicon layer. The source region 23-1 and the drain region 23-3 of the active layer 23 are doped with impurities according to the type of TFT, such as a driving TFT or a switching TFT.

A gate electrode 25 corresponding to the active layer 23 and an interlayer insulating layer 26 that buries the gate electrode 25 are formed on an upper surface of the gate insulating layer 24.

After forming a contact hole H1 in the interlayer insulating layer 26 and the gate insulating layer 24, a source electrode 27-1 and a drain electrode 27-2 on the interlayer insulating layer 26 are formed to contact the source region 23-1 and the drain region 23-3, respectively.

The passivation layer 27 is formed above the thin film transistor formed as above, and the pixel electrode 28-1 of the OLED 28 is formed above the passivation layer 27. The pixel electrode 28-1 is in contact with the drain electrode 27-2 of the TFT via a via hole H2 formed in the passivation layer 27. The passivation layer 27 may be formed of an inorganic material and/or an organic material in a single layer or in two or more layers. The passivation layer 27 may be formed as a planarization layer having an upper surface that is flat regardless of curvedness of a layer thereunder, or that is curved according to the curvedness of the layer thereunder. In an embodiment, the passivation layer 27 may be formed of a transparent insulating material to achieve a resonance effect.

After forming the pixel electrode 28-1 on the passivation layer 27, a pixel defining layer 29 is formed of an organic material and/or an inorganic material to cover the pixel electrode 28-1 and the passivation layer 27, and is open to have the pixel electrode 28-1 exposed.

The intermediate layer 28-2 and a counter electrode 28-3 are formed at least on the pixel electrode 28-1. In another embodiment, the counter electrode 28-3 may be formed on the entire surface of the display substrate D. In this case, the counter electrode 28-3 may be formed on the intermediate layer 28-2 and the pixel defining layer 29. In the following description, for convenience of explanation, a case in which the counter electrode 28-3 is formed on the intermediate layer 28-2 and the pixel defining layer 29 is mainly described in further detail.

In an embodiment, the pixel electrode 28-1 may function as an anode, and the counter electrode 28-3 may function as a cathode. However, the polarities of the pixel electrode 28-1 and the counter electrode 28-3 may be reversed.

The pixel electrode 28-1 and the counter electrode 28-3 are insulated from each other by the intermediate layer 28-2, and may apply voltages of opposite polarities to the intermediate layer 28-2 such that light is emitted from an organic emission layer (not shown).

The intermediate layer 28-2 may include the organic emission layer. In an embodiment, the intermediate layer 28-2 may include the organic emission layer, and may further include at least one of a hole injection layer (HIL), a hole transport layer (HTL), an electron transport layer (ETL), and an electron injection layer (EIL). However, the present disclosure is not limited thereto, and the intermediate layer 28-2 may include the organic emission layer and may further include other various functional layers (not shown).

In an embodiment, the intermediate layer 28-2 may include a plurality of intermediate layers, and the intermediate layers 28-2 may form the display area DA. In this state, the intermediate layers 28-2 may be arranged spaced apart from each other in the display area DA.

A unit pixel includes a plurality of sub-pixels, and the sub-pixels may emit light of various colors. For example, the sub-pixels may include sub-pixels that emit light of red, green, and blue, or sub-pixels (not shown) that emit light of red, green, blue, and white.

In the above-described apparatus for manufacturing a display apparatus or in an apparatus (not shown) for manufacturing a display apparatus that is to be described later, various layers may be formed in the display substrate D. For example, the display apparatus manufacturing apparatus 100 may include, in the display substrate D, at least one of the intermediate layers 28-2 and the counter electrodes 28-3. In an embodiment, the display apparatus manufacturing apparatus 100 may include at least one of the HIL, the HTL, the EIL, and the ETL, and at least one of the functional layers of the intermediate layer 28-2. In particular, when the display apparatus manufacturing apparatus 100 includes at least one of the intermediate layers 28-2 in the display substrate D, the display apparatus manufacturing apparatus 100 may manufacture one layer using a plurality of deposition materials or may concurrently (e.g., simultaneously) manufacture a plurality of layers.

In this case, in the display apparatus manufacturing apparatus 100, the same layers as the above layers may be formed in the display area DA. In an embodiment, at least one of the intermediate layers 28-2 and the counter electrodes 28-3 may be formed on the entire surface of the display area DA. In this case, an area where at least one of the intermediate layers 28-2 and the counter electrodes 28-3 are formed may be less than or equal to the area of the display area DA. Such at least one of the intermediate layers 28-2 and the counter electrodes 28-3 may be arranged on the pixel defining layer 29 and the pixel electrode 28-1. In this case, the area, for example, the display area DA, where at least one of the intermediate layers 28-2 and the counter electrodes 28-3 are formed may be less than an area where the pixel defining layer 29 is formed. In an embodiment, the pixel defining layer 29 may be formed in part of the entire surface of the substrate 21. In this case, an outermost edge PD of the area where the pixel defining layer 29 is formed may be arranged between an edge of the display area DA and an edge of the non-display area NDA. In another embodiment, the outermost edge PD of the area where the pixel defining layer 29 is formed may match the edge of the non-display area NDA. In this case, the above-described protruding portion (not shown) may be arranged between the display area DA and the outermost edge PD of the area where the pixel defining layer 29 is formed.

When the protruding portion is arranged as above, according to an operation of the magnetic force generation unit (150 of FIG. 1), the protruding portion may be in close contact with the substrate 21. In this state, the protruding portion may be in contact with the pixel defining layer 29 or in close contact with the pixel defining layer 29. In this case, the pixel defining layer 29 may prevent the protruding portion from being in close contact with the substrate 21 directly, thereby preventing the substrate 21 from being damaged or broken. Further, the pixel defining layer 29 may absorb part of a force applied to the protruding portion.

Accordingly, since the display apparatus 20 as described above may be prevented from being stamped by the mask during manufacture, productivity may be improved and defects may be reduced. Further, in the display apparatus 20, a distance between the display area DA and the non-display area NDA may be reduced.

Further, the thin film encapsulation layer E as described above may include a plurality of inorganic layers, or an inorganic layer and an organic layer.

The organic layer of the thin film encapsulation layer E may include a polymer, and may include any one of polyethylene terephthalate, polyimide, polycarbonate, epoxy, polyethylene, and polyacrylate, in a single layer or a multilayer. Further, the organic layer may include polyacrylate, and, in an embodiment, polymerized monomer compositions including diacrylate monomers and triacrylate monomers. The monomer composition may further include monoacrylate monomer. In an embodiment, the monomer composition may further include a well-known photoinitiator, such as TPO, but the present disclosure is not limited thereto.

The inorganic layer of the thin film encapsulation layer E may be a single layer or a multilayer including metal oxide or metal nitride. In an embodiment, the inorganic layer may include any one of SiNx, $Al_2O_3$, $SiO_2$, and $TiO_2$.

A top layer of the thin film encapsulation layer E, which is exposed to the outside, may be formed in an inorganic layer to prevent or substantially prevent intrusion of moisture into the OLED.

In an embodiment, the thin film encapsulation layer E may include at least one sandwich structure in which at least one organic layer is inserted between at least two inorganic layers. In another example, the thin film encapsulation layer E may include at least one sandwich structure in which at least one inorganic layer is inserted between at least two organic layers. In another example, the thin film encapsulation layer E may include the sandwich structure in which at least one organic layer is inserted between at least two inorganic layers and the sandwich structure in which at least one inorganic layer is inserted between at least two organic layers.

In an embodiment, the thin film encapsulation layer E may include a first inorganic layer, a first organic layer, and a second inorganic layer sequentially from the top of the OLED.

In another example, the thin film encapsulation layer E may include a first inorganic layer, a first organic layer, a second inorganic layer, a second organic layer, and a third inorganic layer, sequentially from the top of the OLED.

In another example, the thin film encapsulation layer E may include a first inorganic layer, a first organic layer, a second inorganic layer, a second organic layer, a third inorganic layer, a third organic layer, and a fourth inorganic layer, sequentially from the top of the OLED.

In an embodiment, a halogenated metal layer including LiF may be additionally included between the OLED and the first inorganic layer. The halogenated metal layer may prevent the OLED from being damaged when the first inorganic layer is formed in a sputtering method.

In an embodiment, the first organic layer may have an area less than that of the second inorganic layer, and the second organic layer may have an area less than that of the third inorganic layer.

Accordingly, the display apparatus 20 may implement a precise image.

Figure 6:
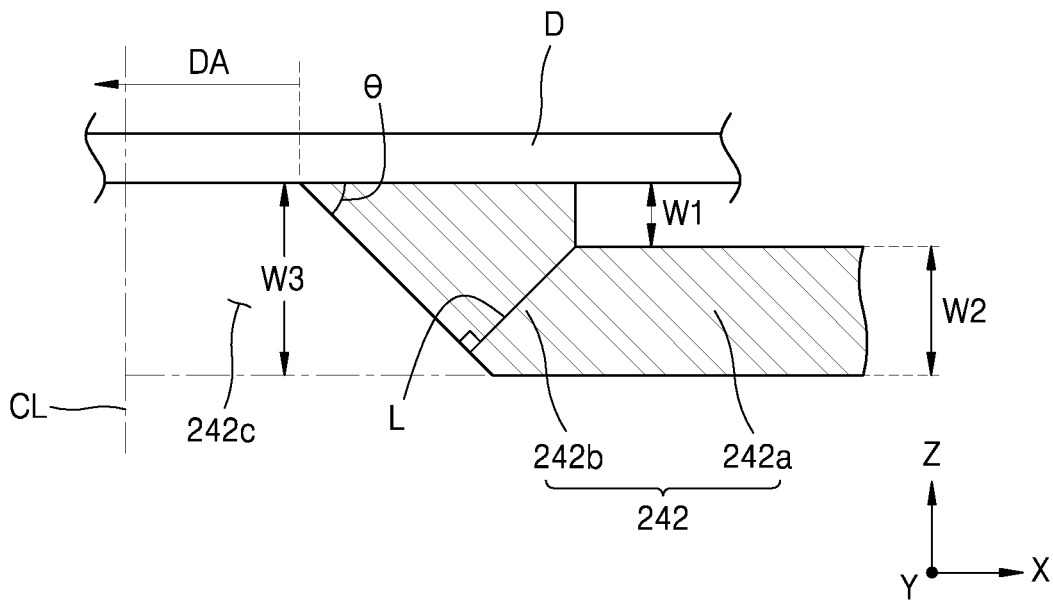
FIG. 6 is a cross-sectional view of a part of a mask assembly of an apparatus for manufacturing a display apparatus, according to another embodiment.

FIG. 6 is a cross-sectional view of a part of a mask assembly of an apparatus for manufacturing a display apparatus, according to another embodiment.

Referring to FIG. 6, in an embodiment, the apparatus (not shown) for manufacturing a display apparatus may include a chamber (not shown), a first support unit (not shown), a second support unit (not shown), a mask assembly (not shown), a source unit (not shown), a magnetic force generation unit (not shown), a vision unit (not shown), and a pressure control unit (not shown). In an embodiment, the chamber, the first support unit, the second support unit, the source unit, the magnetic force generation unit, the vision unit, and the pressure control unit may be the same as or similar to those described with respect to FIGS. 1 and 2, and further detailed descriptions thereof are omitted.

The mask assembly may include a mask frame (not shown) and a mask 242. In an embodiment, the mask frame may be the same as or similar to that described with respect to FIGS. 1 and 2, and further detailed description thereof is omitted.

The mask 242 may include a mask body portion 242a and a protruding portion 242b. In this state, the mask body portion 242a may include at least one opening 242c in a manner that is the same as or similar to that described with respect to FIGS. 1 and 2.

The protruding portion 242b may protrude from the mask body portion 242a toward the display substrate D. In this state, the protruding portion 242b may form a boundary of the opening 242c, and a surface of the protruding portion 242b forming the boundary of the opening 242c may be inclined in a first direction, for example, an X direction or a Y direction. In particular, the inclined surface of the protruding portion 242b may form an inner surface defining the opening 242c.

In the above-described case, an angle θ formed between the inclined surface and a surface facing the display substrate D of the protruding portion 242b may be greater than about 50° and less than or equal to 60°.

In the above-described case, a thickness W3 of the inclined portion of the protruding portion 242b may vary in a direction away from the opening 242c, for example, in the first direction. In an embodiment, the thickness W3 of the inclined portion of the protruding portion 242b may increase as it is farther away from the center CL of the opening 242c.

In the above-described case, a gap W1 between a surface of the mask body portion 242a and a surface of the display substrate D may be greater than or equal to 30 μm. When a gap between the surface of the mask body portion 242a and the surface of the display substrate D is less than 30 μm, as the mask body portion 242a is in contact with the display substrate D due to a magnetic force applied by the magnetic force generation unit, the display substrate D may be damaged.

In an embodiment, the thickness W2 of the mask body portion 242a may be less than or equal to 70 μm. In this state, when the thickness of the mask body portion 242a exceeds 70 μm, due to the magnetic force provided by the magnetic force generation unit a magnetic force is generated in the mask body portion 242a, and, thus, the mask body portion 242a is not in close contact with the display substrate D or in very close contact with the display substrate D, thereby damaging or breaking the display substrate D.

In an embodiment, for the protruding portion 242b, a shortest distance L from a point where the protruding portion 242b and the mask body portion 242a meet to an inclined portion of the protruding portion 242b may be greater than or equal to 34% of the thickness of the protruding portion 242b. In an embodiment, for example, the thickness of the protruding portion 242b, that is, a distance from a surface contacting the display substrate D and another surface facing the surface contacting the display substrate D, is 100 μm, and the vertical distance L may be greater than or equal to 34 μm. In this state, when the vertical distance L is less than 34 μm, the protruding portion 242b may be detached or deformed from the mask body portion 242a due to heat or an external force.

When the protruding portion 242b includes the inclined surface as described above, the shadow area may be removed from an edge area of the opening 242c. In other words, the deposition material injected from the left side of the protruding portion 242b to the inclined surface of the protruding portion 242b with respect to FIG. 6 may be blocked by the inclined surface of the protruding portion 242b. Further, part of the deposition material injected from the right side of the protruding portion 242b with respect to FIG. 6 is blocked by the mask body portion 242a, and among the deposition material that is not blocked, the deposition material injected at an angle similar to an angle formed by the inclined surface of the protruding portion 242b and an angle of the deposition material injected on the display substrate D may be deposited on the display substrate D. In this case, the display area DA may start from a portion where the protruding portion 242b contacts the display substrate D.

Accordingly, the display apparatus manufacturing apparatus 100 and the method of manufacturing a display apparatus may reduce the shadow area, and, thus, the deposition material may be deposited.

Figure 7:
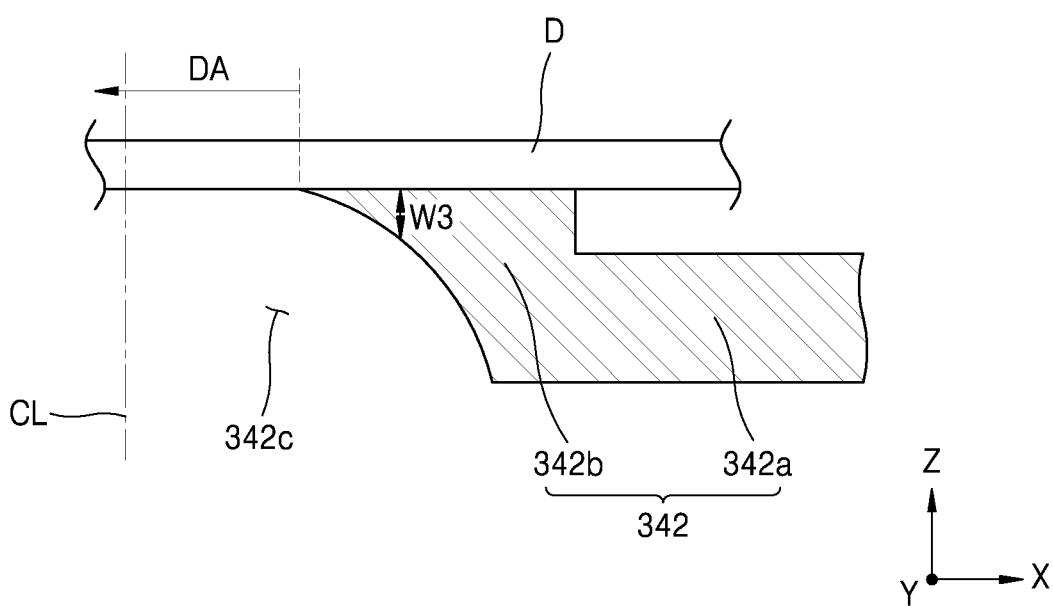
FIG. 7 is a cross-sectional view of a part of a mask assembly of an apparatus for manufacturing a display apparatus, according to another embodiment.

FIG. 7 is a cross-sectional view of a part of a mask assembly of an apparatus for manufacturing a display apparatus, according to another embodiment.

Referring to FIG. 7, in an embodiment, an apparatus (not shown) for manufacturing a display apparatus may include a chamber (not shown), a first support unit (not shown), a second support unit (not shown), a mask assembly (not shown), a source unit (not shown), a magnetic force generation unit (not shown), a vision unit (not shown), and a pressure control unit (not shown). In an embodiment, the chamber, the first support unit, the second support unit, the source unit, the magnetic force generation unit, the vision unit, and the pressure control unit may be the same as or similar to those described with respect to FIGS. 1 and 2, and further detailed descriptions thereof are omitted.

The mask assembly may include a mask frame (not shown) and a mask 342. In an embodiment, the mask frame may be the same as or similar to that described with respect to FIGS. 1 and 2, and a further detailed description thereof is omitted.

The mask 342 may include a mask body portion 342a and a protruding portion 342b. In this state, the mask body portion 342a may include at least one opening 342c in a manner that is the same as or similar to that described with respect to FIGS. 1 and 2.

The protruding portion 342b may protrude from the mask body portion 342a toward the display substrate D. In this state, the protruding portion 342b may form a boundary of the opening 342c, and a surface of the protruding portion 342b forming the boundary of the opening 342c may be curved. For example, the surface of the protruding portion 342b forming the boundary of the opening 342c may have a curved surface.

As described above, in a method of forming an opening, after arranging photoresist on both surfaces of a base member (not shown), a pattern is formed, and the pattern may be removed or may be left. In this case, the open portion may be formed between photoresist patterns arranged on both surface of the base member. In this case, the areas of the open portions between the photoresist adjacent to each other of the photoresist arranged on both surfaces of the base member may be different from each other.

Part of the base member may be removed by using an etching solution through the open portion of the photoresist by injecting the etching solution from both surfaces of the base member.

In the above-described case, as the opening 342c is formed in the base member by using the etching solution, the mask 342 may be manufactured. Then, the photoresist arranged on both surfaces of the mask 342 may be removed.

In the above-described case, the thickness W3 of the portion of the protruding portion 342b may increase as it is farther away from the center CL of the opening 342c. In this case, the inner surface defining the opening 342c may be curved.

As described above, the protruding portion 342b may be formed at the circumference of the opening 342c, and a surface of the protruding portion 342b may be curved. When the deposition material is deposited on the display substrate D by using the mask 342, the shadow area may be removed or reduced as described with respect to FIG. 6.

Accordingly, according to the display apparatus manufacturing apparatus 100 and the method of manufacturing a display apparatus, the shadow area may be reduced, and, thus, the deposition material may be deposited.

As described above, in the apparatus for manufacturing a display apparatus and the method of manufacturing a display apparatus according to the above-described embodiments, a portion where the deposition material is not deposited with a constant thickness may be reduced. Further, in the apparatus for manufacturing a display apparatus and the method of manufacturing a display apparatus according to the above-described embodiments, the non-display area of the display apparatus may be reduced.

It should be understood that embodiments described herein are to be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as set forth in the following claims.

What is claimed is:

1. A mask assembly comprising:
a mask frame; and
a mask on the mask frame and having at least one first opening,
wherein the mask comprises:
a mask body portion having the at least one first opening; and
a protruding portion arranged to surround the at least one first opening and comprising an inner surface defining the at least one first opening, the protruding portion protruding from the mask body portion and configured to protrude toward a display substrate and contact the display substrate,
wherein a first opening of the at least one first opening is configured to pass a deposition material therethrough to be deposited in a display area of a display panel, the display area including a light emitting portion comprising a plurality of pixels and a pixel defining layer including second openings into which the first opening of the at least one first opening is configured to pass the deposition material, and
wherein the protruding portion contacts the display substrate between the display area and an outermost edge of the pixel defining layer which covers the display area and extends outside the display area.

2. The mask assembly of claim 1, wherein a distance between the mask body portion and the display substrate in a state in which the protruding portion contacts the display substrate is greater than or equal to about 30 μm, and a thickness of the mask body portion is less than or equal to 70 μm.

3. The mask assembly of claim 1, wherein a thickness of a portion of the protruding portion decreases along a first direction toward a center of the at least one first opening.

4. The mask assembly of claim 3, wherein the inner surface of the protruding portion is inclined along the first direction.

5. The mask assembly of claim 4, wherein an inclination of the inner surface of the protruding portion decreases toward the center of the at least one first opening.

6. The mask assembly of claim 4, wherein an inclination angle of the inner surface of the protruding portion is greater than or equal to about 40° and less than or equal to about 60°.

7. The mask assembly of claim 3, wherein the inner surface of the protruding portion is curved so as to have an arc shape in a plane extending in a thickness direction of the mask.

8. An apparatus for manufacturing a display apparatus, the apparatus comprising:
a chamber in which a display substrate is configured to be arranged;
a mask assembly in the chamber to face the display substrate; and
a source unit in the chamber and configured to supply a deposition material to the display substrate by passing the deposition material through the mask assembly,
wherein the mask assembly comprises:
a mask frame; and
a mask on the mask frame and having at least one first opening,
wherein the mask comprises:
a mask body portion having the at least one first opening; and
a protruding portion arranged to surround the at least one first opening and comprising an inner surface defining the at least one first opening, the protruding portion protruding from the mask body portion and configured to protrude toward the display substrate and contact the display substrate,
wherein a first opening of the at least one first opening is configured to pass a deposition material therethrough to be deposited in a display area of a display panel, the display area including a light emitting portion comprising a plurality of pixels and a pixel defining layer including second openings into which the first opening of the at least one first opening is configured to pass the deposition material, and
wherein the protruding portion contacts the display substrate between the display area and an outermost edge of the pixel defining layer which covers the display area and extends outside the display area.

9. The apparatus of claim 8, wherein a distance between the mask body portion and the display substrate in a state in which the protruding portion contacts the display substrate is greater than or equal to about 30 μm, and a thickness of the mask body portion is less than or equal to 70 μm.

10. The apparatus of claim 8, wherein a thickness of a portion of the protruding portion decreases along a first direction toward a center of the at least one first opening.

11. The apparatus of claim 10, wherein the inner surface of the protruding portion is inclined along the first direction.

12. The apparatus of claim 11, wherein an inclination of the inner surface of the protruding portion decreases toward the center of the at least one first opening.

13. The apparatus of claim 11, wherein an inclination angle of the inner surface of the protruding portion is greater than or equal to about 40° and less than or equal to about 60°.

14. The apparatus of claim 10, wherein the inner surface of the protruding portion is curved so as to have an arc shape in a plane extending in a thickness direction of the mask.

15. A method of manufacturing a display apparatus, the method comprising:
arranging a display substrate and a mask assembly in a chamber;
aligning the display substrate and the mask assembly with each other; and
depositing a deposition material from a source unit on the display substrate by passing the deposition material through the mask assembly,
wherein the mask assembly comprises:
a mask frame; and
a mask on the mask frame and having at least one first opening,
wherein the mask comprises:

a mask body portion having the at least one first opening; and a protruding portion arranged to surround the at least one first opening and comprising an inner surface defining the at least one first opening, the protruding portion protruding from the mask body portion toward the display substrate and contacting the display substrate, wherein the deposition material that passes through a first opening of the at least one first opening is deposited in a display area of a display panel, the display area including a light emitting portion comprising a plurality of pixels and a pixel defining layer including second openings into which the deposition material is deposited, and wherein the protruding portion contacts the display substrate between the display area and an outermost edge of the pixel defining layer which covers the display area and extends outside the display area.

16. The method of claim 15, wherein a distance between the mask body portion and the display substrate in a state in which the protruding portion contacts the display substrate is greater than or equal to about 30 μm, and a thickness of the mask body portion is less than or equal to 70 μm.

17. The method of claim 15, wherein a thickness of a portion of the protruding portion decreases along a first direction in which the inner surface extends toward a center of the at least one first opening.

18. The method of claim 17, wherein the inner surface of the protruding portion is inclined along the first direction.

19. The method of claim 18, wherein an inclination of the inner surface of the protruding portion decreases toward the center of the at least one first opening.

20. The method of claim 19, wherein an inclination angle of the inner surface of the protruding portion is greater than or equal to about 40° and less than or equal to about 60°.

21. The method of claim 17, wherein the inner surface of the protruding portion is curved so as to have an arc shape in a plane extending in a thickness direction of the mask.

22. A method of manufacturing a display apparatus, the method comprising:

arranging a display substrate and a mask assembly in a chamber, the mask assembly comprising a mask having at least one first opening, the mask comprising a protruding portion arranged to surround the at least one first opening and comprising an inner surface defining the at least one first opening;

aligning the display substrate and the mask assembly with each other; and depositing a deposition material from a source unit on a pixel defining layer of the display substrate by passing the deposition material through the mask assembly, wherein a first area where the deposition material is deposited on the display substrate is located within a second area where the pixel defining layer is arranged on the display substrate, wherein the deposition material that passes through a first opening of the at least one first opening is deposited in a display area of a display panel, the display area including a light emitting portion comprising a plurality of pixels and the pixel defining layer including second openings into which the deposition material is deposited, and wherein the protruding portion contacts the display substrate between the display area and an outermost edge of the pixel defining layer which covers the display area and extends outside the display area.

23. The method of claim 22, wherein the mask assembly comprises:

a mask frame; and the mask on the mask frame and having the at least one first opening, wherein the mask comprises:

a mask body portion having the at least one first opening; and the protruding portion protruding from the mask body portion toward the display substrate and contacting the display substrate.

24. The method of claim 23, wherein the protruding portion is arranged between the first area and the second area.

* * * * *